United States Patent
Tanaka et al.

(10) Patent No.: US 9,041,093 B2
(45) Date of Patent: *May 26, 2015

(54) SEMICONDUCTOR MEMORY DEVICE AND MANUFACTURING METHOD THEREOF

(71) Applicant: Kabushiki Kaisha Toshiba, Minato-ku (JP)

(72) Inventors: Hiroyasu Tanaka, Minato-ku (JP); Ryota Katsumata, Yokohama (JP); Hideaki Aochi, Kawasaki (JP); Masaru Kido, Komae (JP); Masaru Kito, Yokohama (JP); Mitsuru Sato, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/153,883

(22) Filed: Jan. 13, 2014

(65) Prior Publication Data
US 2014/0124850 A1    May 8, 2014

Related U.S. Application Data

(63) Continuation of application No. 12/561,451, filed on Sep. 17, 2009, now Pat. No. 8,659,070, which is a continuation of application No. PCT/JP2008/056714, filed on Apr. 3, 2008.

(30) Foreign Application Priority Data

Apr. 6, 2007    (JP) ................... 2007-100086

(51) Int. Cl.
*H01L 29/792*    (2006.01)
*H01L 21/822*    (2006.01)
(Continued)

(52) U.S. Cl.
CPC .......... *H01L 29/792* (2013.01); *H01L 21/8221* (2013.01); *H01L 27/0688* (2013.01);
(Continued)

(58) Field of Classification Search
USPC ........................................ 257/324, E29.131
See application file for complete search history.

(56) References Cited

U.S. PATENT DOCUMENTS 5,599,724 A    2/1997    Yoshida
5,707,885 A    1/1998    Lim
(Continued)

FOREIGN PATENT DOCUMENTS

JP    6-338602    12/1994
JP    2003-78044    3/2003
(Continued)

OTHER PUBLICATIONS

Tetsuo Endoh et al., "Novel Ultrahigh-Density Flash Memory With a Stacked-Surrounding Gate Transistor (S-SGT) Structured Cell," IEEE Transactions on Electron Devices, vol. 50, No. 4, pp. 945-951, Apr. 2003.

(Continued)

*Primary Examiner* — Jamie C Niesz
(74) *Attorney, Agent, or Firm* — Oblon, McClelland, Maier & Neustadt, L.L.P.

(57) ABSTRACT

The semiconductor memory device of the present invention includes a plurality of memory strings having a plurality of electrically reprogrammable memory cells connected in series, the memory strings having a column shaped semiconductor, a first insulation film formed around the column shaped semiconductor, a charge accumulation layer formed around the first insulation film, a second insulation film formed around the charge accumulation film and a plurality of electrodes formed around the second insulation film, a bit line connected to one end of the memory strings via a plurality of selection transistors, and a conducting layer extending in two dimensions and in which the plurality of electrodes of the memory strings and the plurality of electrodes of different memory strings are shared respectively, wherein each end part of the conducting layer is formed in step shapes in a direction parallel with the bit line.

15 Claims, 17 Drawing Sheets

(51) Int. Cl.
*H01L 27/06* (2006.01)
*H01L 27/105* (2006.01)
*H01L 27/115* (2006.01)
*H01L 29/788* (2006.01)

(52) U.S. Cl.
CPC ........ *H01L27/105* (2013.01); *H01L 27/11551* (2013.01); *H01L 27/11556* (2013.01); *H01L 27/11578* (2013.01); *H01L 27/11582* (2013.01); *H01L 29/7881* (2013.01); *H01L 29/7926* (2013.01)

(56) References Cited

U.S. PATENT DOCUMENTS

| | | | |
|---|---|---|---|
| 6,727,544 | B2 | 4/2004 | Endoh et al. |
| 6,870,215 | B2 | 3/2005 | Endoh et al. |
| 7,315,059 | B2 | 1/2008 | Endoh et al. |
| 8,659,070 | B2 * | 2/2014 | Tanaka et al. ............... 257/324 |
| 2004/0238879 | A1 | 12/2004 | Endoh et al. |
| 2006/0091556 | A1 | 5/2006 | Shigeoka |
| 2007/0252201 | A1 * | 11/2007 | Kito et al. ............... 257/331 |
| 2008/0067583 | A1 | 3/2008 | Kidoh et al. |
| 2008/0149913 | A1 | 6/2008 | Tanaka et al. |
| 2008/0175032 | A1 | 7/2008 | Tanaka et al. |

FOREIGN PATENT DOCUMENTS

| | | |
|---|---|---|
| JP | 2004-356207 | 12/2004 |
| JP | 2006-128390 | 5/2006 |

OTHER PUBLICATIONS

European Search Report issued Mar. 22, 2011, in Patent Application No. 08739821.0.

H. Tanaka, et al., "Bit Cost Scalable Technology with Punch and Plug Process for Ultra High Density Flash Memory", Symposium on VLSI Technology Digest of Technical Papers, XP 31139616, Jun. 1, 2007, pp. 14-15.

* cited by examiner

SEMICONDUCTOR MEMORY DEVICE AND MANUFACTURING METHOD THEREOF

CROSS REFERENCE TO RELATED APPLICATIONS

This application is a Continuation of and claims the benefit of priority under 35 U.S.C. §120 from U.S. Ser. No. 12/561,451, filed Sep. 17, 2009, and is based upon and claims the benefit of priority from the prior Japanese Patent Application No. 2007-100086, filed on Apr. 6, 2007, and PCT Application No. PCT/JP2008/056714, filed on Apr. 3, 2008, the entire contents of each of which are incorporated herein by reference.

BACKGROUND OF THE INVENTION

1. Field of the Invention

The present invention is related to a semiconductor memory device in which memory cells which can electrically reprogram data are stacked in three dimensions.

2. Description of the Related Art

While the process of miniaturization demanded by the reduction of semiconductor memory device design rules is gradually becoming more and more difficult, a plurality of semiconductor memory devices in which memory elements are arranged in three dimensions have been proposed in order to increase the degree of memory integration. For example, Japan Laid Open Patent 2003-078044, U.S. Pat. No. 5,599,724, U.S. Pat. No. 5,705,885, and Masuoka et al., "Novel Ultrahigh-Density Flash Memory With a Stacked-Surrounding GateTransistor (S-SGT) Structured Cell", IEEE TRANSACTIONS ON ELECTRON DEVICES, VOL. 50, NO 4, pp 945-951, April 2003

BRIEF SUMMARY OF THE INVENTION

According to one embodiment of the present invention, a semiconductor memory device is proposed including a plurality of memory strings having a plurality of electrically reprogrammable memory cells connected in series, the memory strings having a column shaped semiconductor, a first insulation film formed around the column shaped semiconductor, a charge accumulation layer formed around the first insulation film, a second insulation film formed around the charge accumulation layer and a plurality of electrodes formed around the second insulation film, a plurality of bit lines respectively connected to one end of the plurality of memory strings via a plurality of selection transistors, and a plurality of conducting layers formed by the plurality of electrodes of the plurality of memory strings, the plurality of electrodes of the plurality of memory strings being shared with the plurality of electrodes of different memory strings, the plurality of conducting layers extending in two dimensions respectively, and each end part of the plurality of conducting layers being formed in step shapes in a direction parallel with the plurality of bit lines.

According to one embodiment of the present invention, a semiconductor memory device is proposed including a substrate, a plurality of memory strings having a plurality of electrically reprogrammable memory cells connected in series, the plurality of memory strings having a column shaped semiconductor, a first insulation film formed around the column shaped semiconductor, a charge accumulation layer formed around the first insulation film, a second insulation film formed around the charge accumulation film and a plurality of electrodes formed around the second insulation film, a plurality of bit lines respectively connected to one end of the plurality of memory strings via a plurality of selection transistors, and a plurality of conducting layers formed by the plurality of electrodes of the plurality of memory strings, the plurality of electrodes of the plurality of memory strings being shared with the plurality of electrodes of different memory strings, the plurality of conducting layers extending in two dimensions respectively on the substrate, and each end part of the plurality of conducting layers being formed in step shapes in a direction parallel with the plurality of bit lines, and the widths of the end part of the plurality of conducting layers each meet the following formula when the plurality of conducting layers of the substrate side is a first conducting layer;

width of the end of ($k$−1)th conducting layer>width of the end of $k$th conducting layer($k$ is an integer equal to or larger than 2).

According to one embodiment of the present invention, a manufacturing method of a semiconductor memory device is proposed including forming a diffusion region of conducting impurities on a semiconductor substrate, forming a plurality of alternating insulation films and a plurality of conductors above the semiconductor substrate, forming a first protective film in a memory region and a second protective film in an end part region on the uppermost conducting layer, forming a plurality of holes in the plurality of alternating insulation films and conductors of the memory region, forming a second insulation film on a surface of the plurality of holes, etching the second insulation film at the bottom part of the plurality of holes, forming a column shaped semiconductor in the plurality of holes, forming a photoresist on the second insulation film, removing the conductor of the end part region, slimming the photoresist film, and forming the end part of the conductors in step shapes by further removing the conductor of the end part region after slimming.

DETAILED DESCRIPTION OF THE INVENTION

The semiconductor memory device and manufacturing method of the same related to the embodiments of the present invention are explained below. However, the present invention is not limited to these embodiments. In addition, the same structural elements in each embodiment have the same symbols and in some cases are not explained again.

The present invention provides a semiconductor memory device in which word line lead lines can be densely arranged and in which memory cells are stacked in three dimensions.
(Embodiment One)

Figure 1:
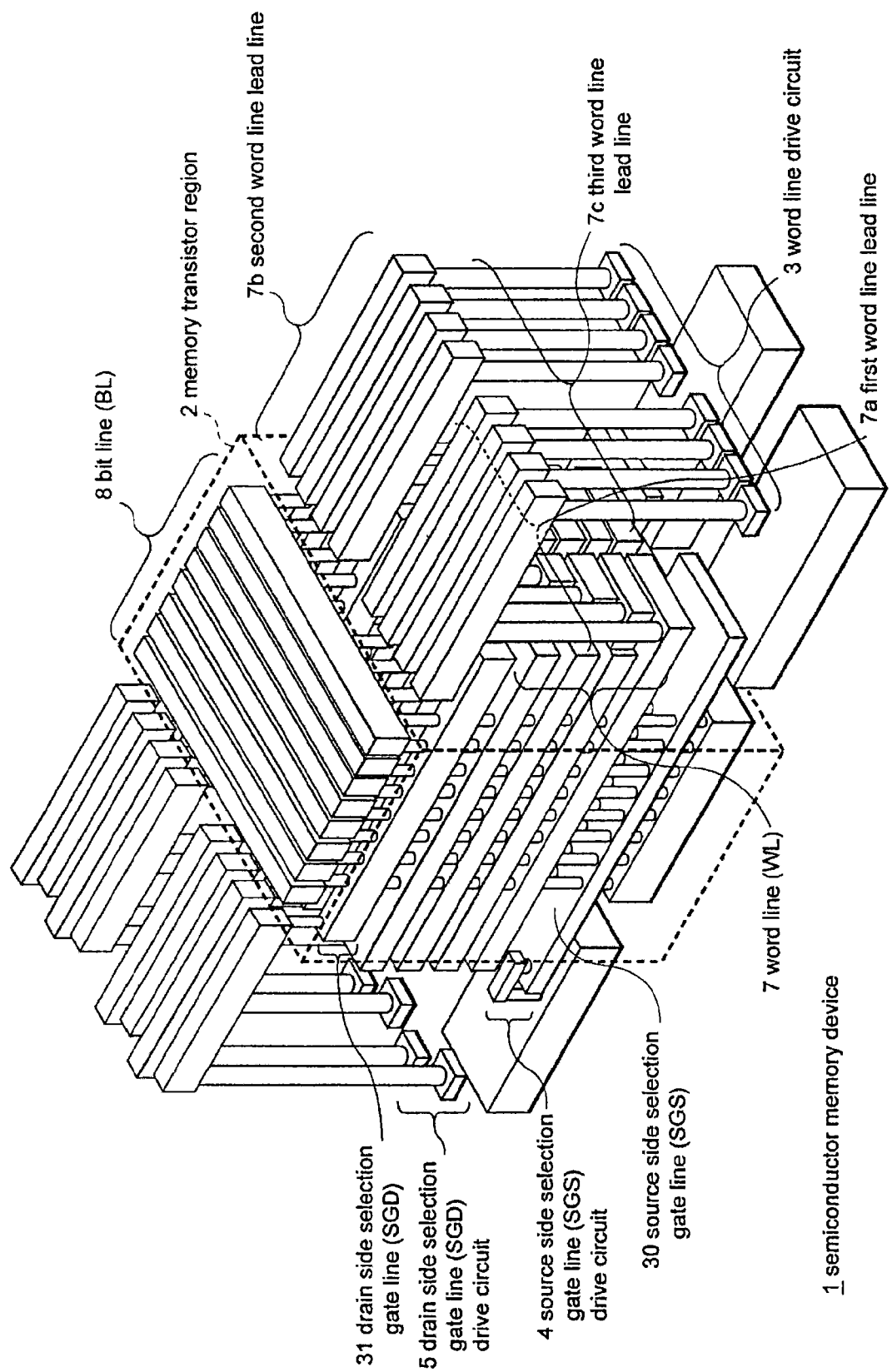
FIG. 1 is an approximate structural view of a semiconductor memory device 1 related to one embodiment of the present invention.

An approximate structural view of a semiconductor memory device 1 of the present invention related to embodiment one is shown in FIG. 1. In the present embodiment, among the semiconductor memory devices 1 of the present invention a NAND type nonvolatile semiconductor memory device will be explained as an example. The semiconductor memory device 1 related to embodiment one includes a memory transistor region 2, a word line driving circuit 3, a source side selection gate line (SGS) driving circuit 4, a drain side selection gate line (SGD) driving circuit 5, a word line (WL) 7, a word line lead line (first word line lead line 7a, second word line lead line 7b and third word line lead line 7c in the present embodiment), a bit line (BL) 8, a source side selection gate line (SGS) 30 and a drain side selection gate line (SGD) 31 etc. As is shown in FIG. 1, in the semiconductor memory device 1 of the present invention related to the present embodiment, memory transistors which form the memory transistor region 2 are formed in one series of processes by stacking a plurality of semiconductor layers. In addition, as is shown in FIG. 1, the word line (WL) 7 extends in two directions in each layer and is formed by the same conducting layer in each layer. The memory transistor region 2 includes a plurality of memory strings 10 formed in the shape of a matrix. The bit line (BL) 8 is connected to a sense amplifier 6 (not shown in the figure) and the drain side selection gate line (SGD) 31 is connected to the drain side selection gate line SGD driving circuit 5 using via holes which are formed at the same time by a photo etching process.

In the semiconductor memory device 1 of the present invention related to the present embodiment, the end parts of each word line of the memory transistor region 2 are formed in steps. In other words, the width in an approximately parallel direction (approximately perpendicular direction to the second word line lead line direction) with a bit line of the end of the word line 7 which is positioned further upwards is smaller than the width in a bit line direction of the word line 7 which is positioned further downwards.

That is, in the present embodiment, because there are four word lines 7 (four layers, four lines) the following relationship is established for WL1 to WL4 from the lowest word line 7:

width in a direction approximately parallel with a bit line of the end of WL1>width in a direction approximately parallel with a bit line of the end of WL2>width in a direction approximately parallel with a bit line of the end of WL3>width in a direction approximately parallel with a bit line of the end of WL4... (1).

In addition, in the case where there are n word lines, the following relationship is established:

width in a direction approximately parallel with a bit line of the end of (k−1)th word line>width in a direction approximately parallel with a bit line of the end of kth word line... (2) (k is an integer equal to or larger than 2 and equal to or lower than n).

Then, the first word line lead line is connected respectively to the end of each word line formed in this step shape. In this way, by forming the end part of each word line 7 in a step shape it is possible to densely arrange the lead lines of the word line 7. Furthermore, in the present embodiment, an example in which there are four word lines is explained. However, the semiconductor memory device 1 of the present invention is not limited to four. It is possible to suitably change the number of word lines according to the desired memory capacity and chip area.

Figure 2:
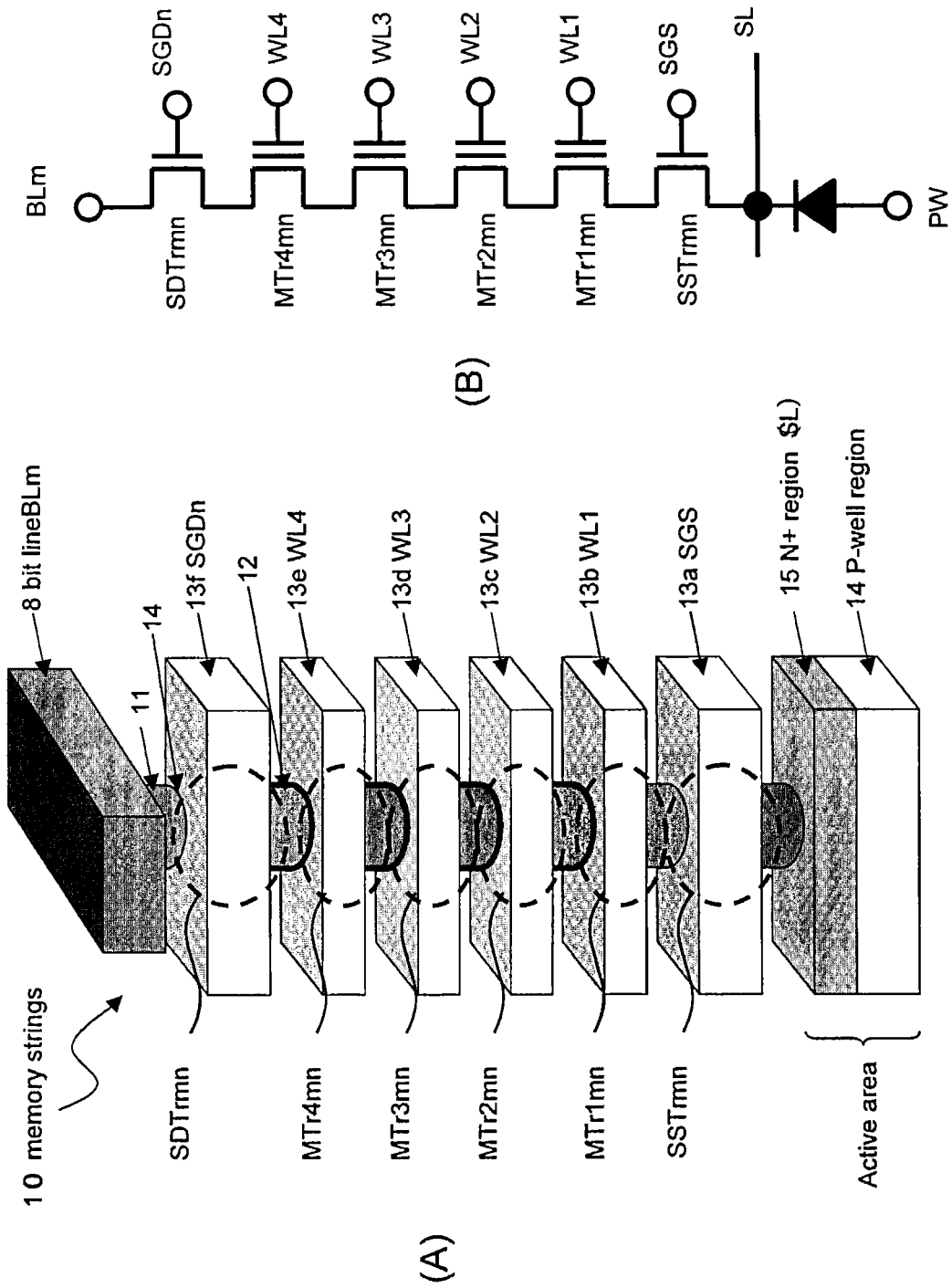
FIG. 2 is a diagram which shows an approximate structure of one memory string 10 of the semiconductor memory device 1 related to one embodiment of the present invention.

The memory transistor region 2 of the semiconductor memory device 1 of the present invention related to the present embodiment includes m x n (m, n are both integers) memory strings 10 which are formed in the shape of a matrix. The present embodiment is explained in the case when the memory transistor region 2 includes 8×8 memory strings. An approximate structure of one memory string 10 (here, the mnth memory string) of the semiconductor memory device 1 of the present invention related to the present embodiment is shown in FIG. 2(A) and its equivalent circuit diagram is shown in FIG. 2(B). The memory strings 10 include four memory transistors MTr1mn to MTr4mn and two selection transistors SSTrmn and SDTrmn, each connected in series respectively. In one of the memory strings 10, a column shaped semiconductor 11 is formed in an $N^+$ region 15 which is formed in a P type region (P-Well region) 14 on a semiconductor substrate, and an insulation film 12 is formed around the semiconductor 11 and flat shaped (planar shaped) electrodes 13a-13f are formed around the insulation film 12. The electrodes 13a-13f, the insulation film 12 and the column shaped semiconductor 11 form the memory transistors MTr1mn-MTr4mn, the selection transistor SSTrmn and the selection transistor SDTrmn. A silicon oxide film, for example, can be used for the insulation film 12 of the selection transistor SSTrmn and the selection transistor SDTrmn. In addition, the insulation film 12 of the memory transistors MTr1mn-MTr4mn include a charge accumulation layer, for example, stacked films of a silicon oxide film, silicon nitride film, and silicon oxide film. The electrodes 13b-13e each become the word lines WL1-WL4 (7), the electrode 13f becomes the drain side selection gate line SGDn and the electrode 13a becomes the source side selection gate line SGS. In addition, a bit line BLm 8 is connected to one end of the source/drain of the selection transistor SDTrmn and a source line SL ($N^+$ region 15 in the present embodiment) is connected to the source/drain of the selection transistor SSTrmn. Furthermore, in the present embodiment, an example in which four memory transistors MTr of one memory string 10 (an example of four word lines 7) are connected in series is shown. However, it is not limited to four. The number of memory transistors MTr which form one memory string 10 may be decided according to capacity.

In the present embodiment, each of the memory strings 10 includes a column shaped semiconductor on an $n^+$ region (not shown in the figure) which is formed in the P-well region 14 of the semiconductor substrate. Each of the memory strings 10 is arranged in a matrix shape on a perpendicular in-plane surface of the column shaped semiconductor. Further, this column shaped semiconductor may have a cylindrical shape or a prism shape. In addition, the column shaped semiconductor refers not only to a symmetrical structure about a center line but also to a column shaped semiconductor which has a step structure in which column shaped semiconductors having a different center line are stacked above the column shaped semiconductor which has symmetry either side of the center line.

In addition, as stated above, because each word line WL1-WL4 (7) is formed by a common conducting layer in each layer (memory cell layer) in which a plurality of memory cells are formed in two dimensions (that is, in a plane direction) it is possible to significantly reduce the number of word line driving circuits 3 and realize a reduction in the area of the chip. In addition, the ends of each word line 7 of the memory transistor region 2 are formed in a step shape and first word line lead lines are respectively connected to the ends of each word line which is formed in this step shape. In this way, by forming the ends of each word line 7 in a step shape it is possible to densely arrange the lead lines of the word lines 7.

(Manufacturing Method of a Semiconductor Memory Device of the Present Invention Related to Embodiment One)

A manufacturing method of the semiconductor memory device 1 of the present invention related to embodiment one is explained below using FIG. 3 to FIG. 9. Furthermore, the manufacturing method explained below is one example of a manufacturing method of the semiconductor memory device 1 of the present invention related to the present embodiment and is not limited to this example. Furthermore, in FIG. 3 to FIG. 9, the memory transistor region 2 and the word line lead lines 7a-7c of the semiconductor memory device 1 related to embodiment one are shown for the purposes of explanation. In addition, in the semiconductor memory device 1 of the present invention related to embodiment one, an example is explained where there are four word lines 7 (four layers of an amorphous silicon film which form the word lines 7). Furthermore, the number of word lines 7 is not limited to this.

First, the manufacturing process of peripheral circuit transistors and source side selection gate 30 (lower selection transistor) will be explained. Furthermore, in FIG. 3 to FIG. 9 of the present embodiment, for the purposes of explanation the parts below the source side selection gate 30 are collectively shown as the substrate part 100 and each structural element is not illustrated. An element separation region (STI) 102 is formed above a semiconductor substrate 101. Next, boron (B) ions are implanted and a P-well region 104 is formed. Further, boron (B) ions are implanted near the surface of the semiconductor substrate 101 and a channel implant region 106 which adjusts the threshold value Vth of a transistor is formed. Here, an N channel type transistor is shown as the transistor which is formed in the peripheral circuit region, however, by implanting ions which create the N type in a desired region, an N-well region is formed and a P channel type transistor is formed. Next, ion impurities such as phosphorus (P) are implanted only in the memory transistor region 2 and an $n^+$ diffusion region 107 which becomes a source line SL is formed. Next, a silicon nitride film and a silicon oxide film are deposited, a photoresist is formed to a desired pattern and a silicon nitride film and silicon oxide film are formed only in the memory transistor region 2 by wet etching. Next, a thick film gate insulation film of a high voltage transistor of the peripheral circuit region is formed, a pattern is formed by the photoresist so that the regions apart from the memory transistor region 2 and the high voltage transistor region are opened, and a thick film gate insulation film is formed by wet etching. A thin film gate insulation film of a high speed operation transistor is formed in the region which is wet etched. Next, after a polysilicon (poly-Si) film and a silicon nitride film which are added with conductive type impurities such as phosphorous (P) are deposited, etching is performed and a gate electrode 110a and a cap silicon nitride film 113a of a transistor in the peripheral circuit region are formed, and a gate electrode 110b and a cap silicon nitride film 113b of a selection transistor in the memory cell region are formed. Next, ions such as P ions or As ions are implanted in the region of the N channel type transistor of the peripheral circuit region and an N type region 112 is formed. Next, the silicon nitride film which is deposited on the entire surface of the substrate is etched by anisotropic etching and a side wall 114 is formed. Next, arsenic (As) ions are implanted in the region of an N channel type transistor of the peripheral circuit region and a source/drain region 116 is formed. Next, B ions are implanted in a P channel type transistor of the peripheral circuit region and a source/drain region is formed. Next, a silicon nitride film (barrier silicon nitride film) 118 is formed on the entire surface of the substrate. Next, an interlayer insulation film (BPSG film) 124 is formed on the entire surface of the substrate and a planarization process is performed by CMP for example.

Next, a photoresist layer is formed and a hole 126 for forming a selection transistor in the shape of a matrix is formed in the memory transistor region 2. This hole 126 is only formed for the number of memory strings (8×8=64 in the present embodiment) in the memory transistor region 2. Next, after implanting P ions etc only in the memory transistor region 2, a silicon oxide film and an amorphous silicon film are formed only on a side wall and bottom part of a hole by a method such LPCVD. Next, the silicon oxide film and amorphous silicon film at the bottom part of the hole are etched by RIE and amorphous silicon films 128a to 128d are formed. Next, after forming the amorphous silicon films, a planarization process is performed by CMP for example, and an amorphous silicon film 130 is formed. Next, P ions etc are implanted only in the channel region of the memory transistor. Next, As ions etc are implanted only in the memory transistor region 2 and after forming a drain diffusion layer the As ions are activated by RTA. Then, the peripheral circuit transistor and the lower part selection transistor are complete. Here, P ions are implanted into the channel part. However, ions do not have to be implanted. Next, a silicon nitride film 132 and a silicon oxide film 134 are formed in order on the entire surface of the substrate. The substrate part 100 is completed by the processes up to this point in the present embodiment. The structure and manufacturing process of the substrate part 100 are not limited to the examples stated above.

Figure 3:
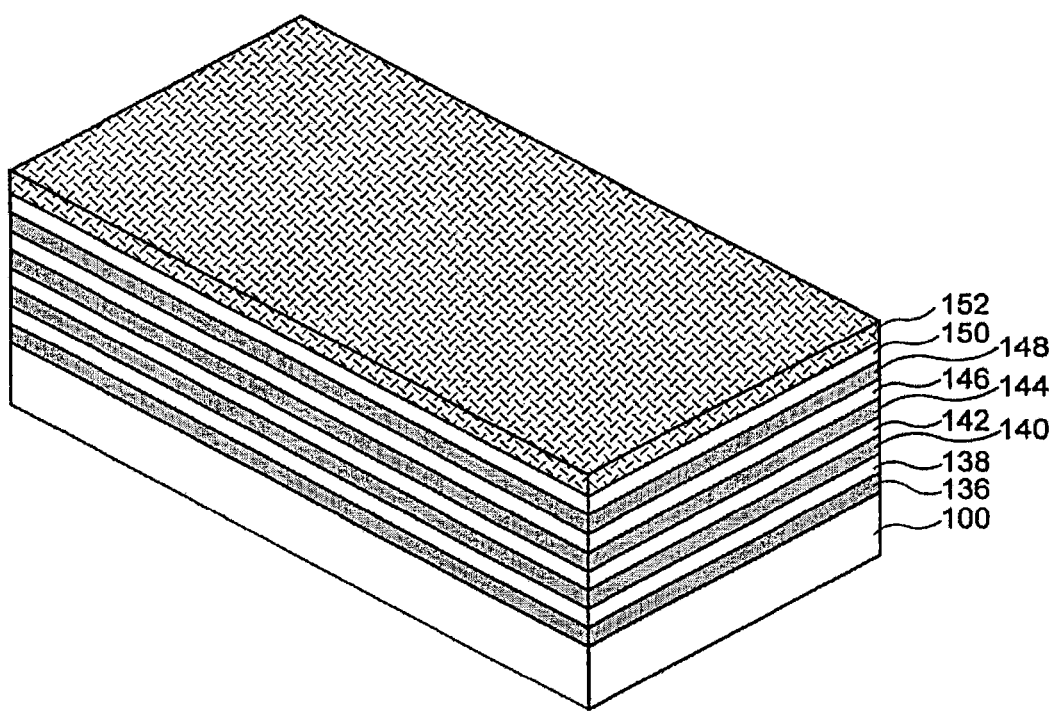
FIG. 3 is a diagram which shows a manufacturing process of the semiconductor memory device 1 related to one embodiment of the present invention.

Next, as is shown in FIG. 3, an amorphous silicon film 136, a silicon oxide film 138, an amorphous silicon film 140, a silicon oxide film 142, an amorphous silicon film 144, a silicon oxide film 146, an amorphous silicon film 148, a silicon oxide film 150, and a silicon nitride film 152 are formed in order on the entire surface of the substrate. The amorphous silicon films 136, 140, 144 and 148 become the word lines 7. In the present embodiment, the amorphous silicon films 136, 140, 144 and 148 are each formed to a thickness of 100 nm, and the silicon oxide films 138, 142, 146 and 150 are each formed to a thickness of 70 nm by a plasma CVD method. In addition, in the present embodiment, the silicon nitride film 152 is formed to a thickness of 200nm by a CVD method. In addition, the amorphous silicon films 136, 140, 144 and 148 may be formed as n type amorphous silicon films for lowering resistance. In addition, polysilicon may be used instead of amorphous silicon.

Figure 4:
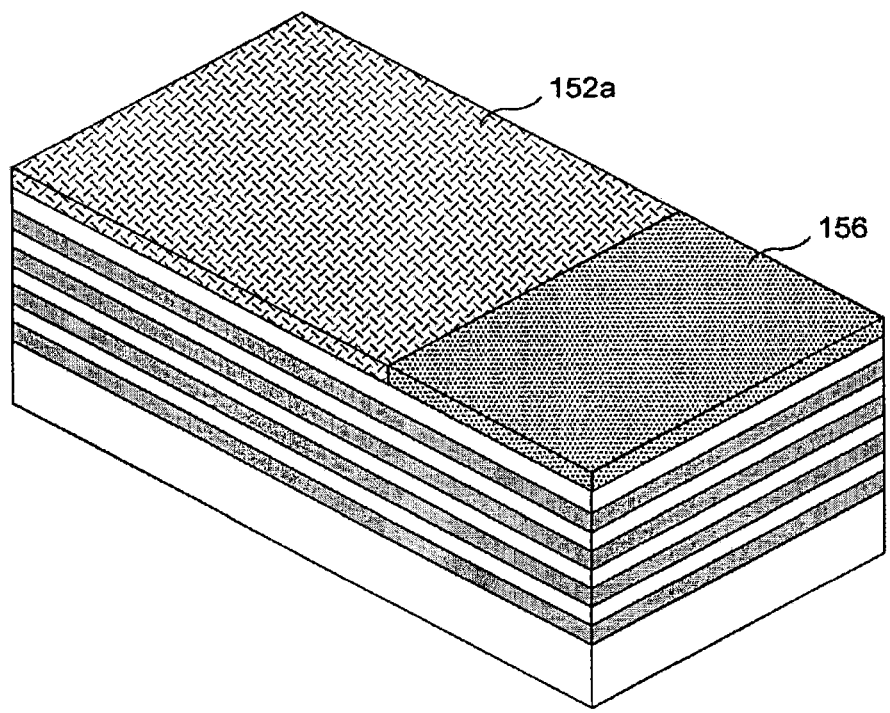
FIG. 4 is a diagram which shows a manufacturing process of the semiconductor memory device 1 related to one embodiment of the present invention.

Next, a photoresist 154 (not shown in the figure) is formed on the silicon nitride film 152, the silicon nitride film 152 is patterned by a RIE process (Reactive Ion Etching) and a silicon nitride film 152a is formed (FIG. 4). Next, a region in which this silicon nitride film 152 is removed becomes the end region of a word line 7 for connecting a first word line lead line. Next, a BPSG film 156 is formed at a thickness of 600 nm for example, on the entire surface of the substrate and a CMP process is performed until the surface of the silicon nitride film 152 is exposed (FIG. 4).

Figure 5:
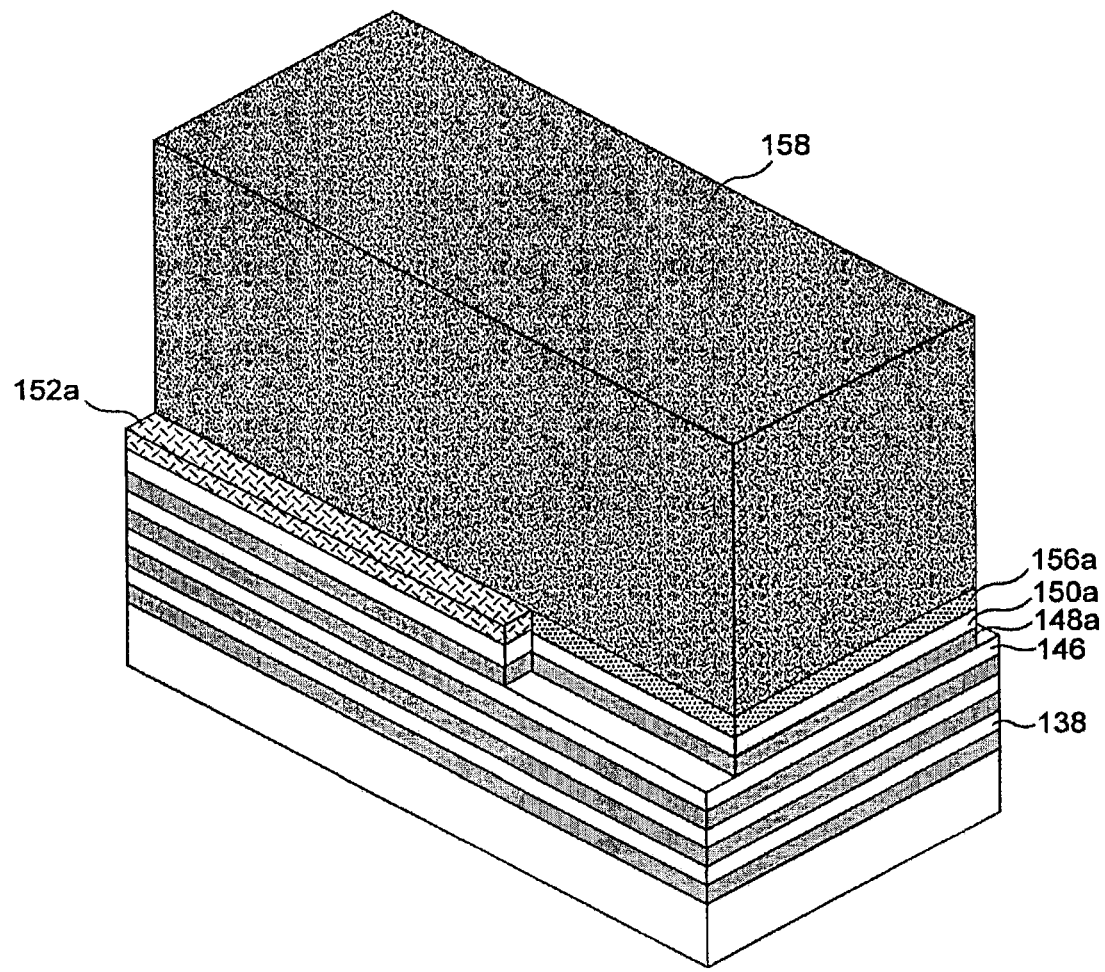
FIG. 5 is a diagram which shows a manufacturing process of the semiconductor memory device 1 related to one embodiment of the present invention.

Next, a photoresist 158 is formed on one part of the silicon nitride film 152a and one part of the BPSG film 156 as shown in FIG. 5. The photoresist 158 and silicon nitride film 152a are used as a mask, a BPSG film 156, a silicon oxide film 150 and amorphous silicon film 148 are etched using the silicon oxide film 146 as an etching stopper, and a BPSG film 156a, silicon oxide film 150a and amorphous silicon film 148a are formed. At this time, after the BPSG film 156, a silicon oxide film 150 and amorphous silicon film 148 are etched, a peeling and removing process of the photoresist 158 is not performed. The width removed from the BPSG film 156, silicon oxide film 150 and amorphous silicon film 148 becomes the width which is exposed of the lowest silicon oxide film 138. Furthermore, in the present embodiment, an example of etching stacked films is explained using a silicon oxide film as an etching stopper. However, the stacked films may also be etched using an amorphous silicon film as an etching stopper.

Figure 6:
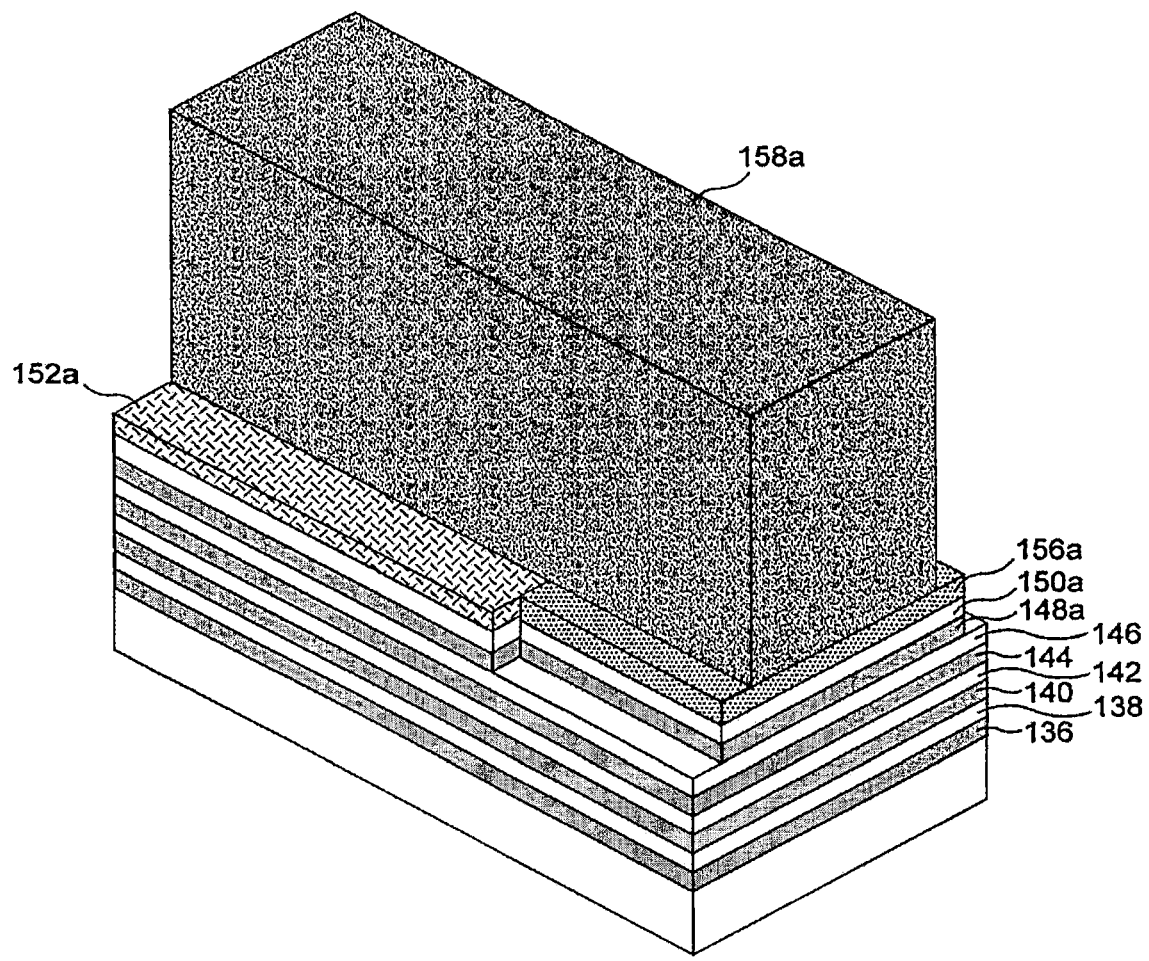
FIG. 6 is a diagram which shows a manufacturing process of the semiconductor memory device 1 related to one embodiment of the present invention.

Next, the remaining photoresist 158 is slimmed and the photoresist 158a is formed as shown in FIG. 6. Then, the photoresist 158a and the silicon nitride film 152a are used as a mask, the BPSG film 156a, silicon oxide film 150a, amorphous silicon film 148a, silicon oxide film 146 and amorphous silicon film 144 are etched and the BPSG film 156b, silicon oxide film 150b, amorphous silicon film 148b, silicon oxide film 146a and amorphous silicon film 144a are formed (none of the these films are shown in the figure). In the semiconductor memory device 1 of the present invention related to the present embodiment, it is possible to form the ends parts of the amorphous silicon films 136, 142, 146 and 148 (word lines 7) in a step shape by repeating an etching process after slimming the photoresist.

Figure 7:
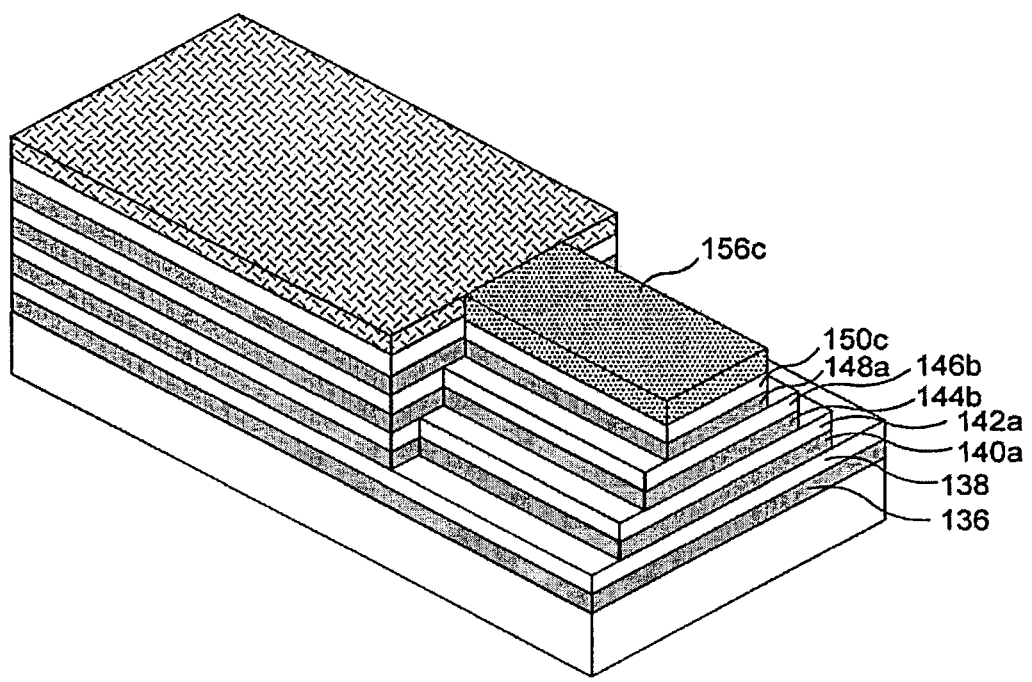
FIG. 7 is a diagram which shows a manufacturing process of the semiconductor memory device 1 related to one embodiment of the present invention.

More specifically, the photoresist 158a is slimmed again and the photoresist 158b (not shown in the figure) is formed. Then, the photoresist 158b and the silicon nitride film 152a are used as a mask, the BPSG film 156b, silicon oxide film 150b, amorphous silicon film 148b, silicon oxide film 146a, amorphous silicon film 144a, silicon oxide film 142 and amorphous silicon film 140 are etched, and a BPSG film 156c, silicon oxide film 150c, amorphous silicon film 148c, silicon oxide film 146b, amorphous silicon film 144b, silicon oxide film 142a and amorphous silicon film 140a are formed (FIG. 7). Then, the photoresist 158b is removed.

In this way, it is possible to form the end parts of the amorphous silicon films 136, 142, 146 and 148 (word lines 7) in a step shape by repeating an etching process after slimming the photoresist.

Figure 8:
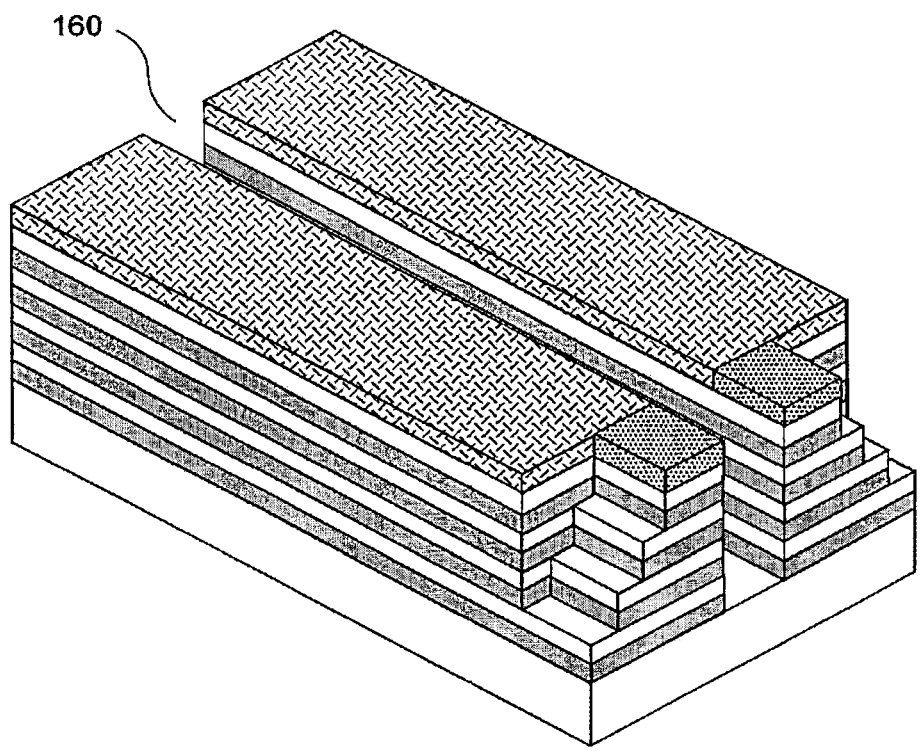
FIG. 8 is a diagram which shows a manufacturing process of the semiconductor memory device 1 related to one embodiment of the present invention.

Next, a photoresist (not shown in the figure) is formed and a slit 160 is formed using etching to remove a part of the BPSG film 156c, silicon oxide film 150c, amorphous silicon film 148c, silicon oxide film 146b, amorphous silicon film 144b, silicon oxide film 142a, amorphous silicon film 140a, silicon oxide film 138 and amorphous silicon film 136 (FIG. 8).

Next, a hole 170 (not shown in the figure, referred to below as memory plug hole) for forming the column shaped part of a memory cell into the shape of a matrix to match the hole 126 (not shown in the figure) of the memory transistor region 2. This memory plug hole is formed only for the number of memory strings of the memory transistor region.

Next, a silicon oxide film, silicon nitride film, silicon oxide film and amorphous silicon film (all not shown in the figure) are formed in this order. Next, the amorphous silicon film is etched using RIE and a spacer is formed. The silicon oxide film (first insulation film), silicon nitride film and silicon oxide film (second insulation film) form what is called an ONO film. The silicon nitride film becomes a charge accumulation layer of a memory transistor. Further, an insulation film such as an alumina film may be used instead of the silicon oxide film.

Next, a silicon oxide film, silicon nitride film and silicon oxide film are etched using the spacer of the amorphous silicon film which is formed in the memory plug hole 170, and a part of the amorphous silicon film 130 which is formed in the hole 126 is exposed. Next, after forming an amorphous silicon film so that the memory plug hole 170 is filled, a planarization process is performed by CMP for example. Next, As ions are implanted, an RTA process is performed and a drain diffusion layer 172 is formed. Then, an upper part selection transistor is formed by a process similar to the process for forming a lower part selection transistor.

Figure 9:
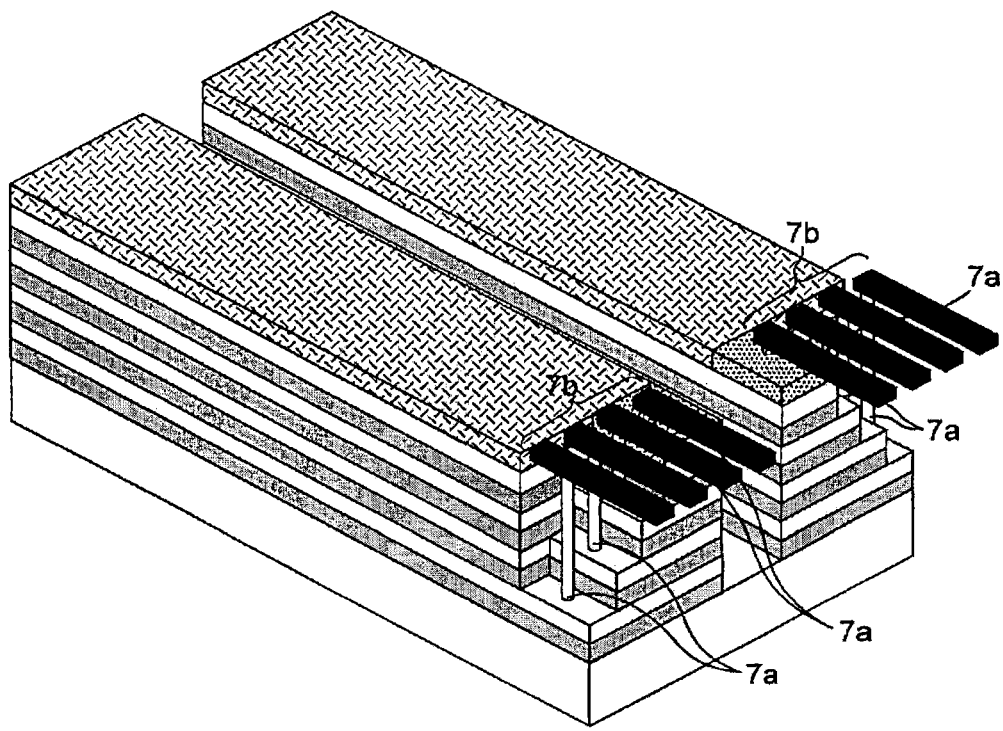
FIG. 9 is a diagram which shows a manufacturing process of the semiconductor memory device 1 related to one embodiment of the present invention.

Next, as is shown in FIG. 9, a contact hole is formed up to the amorphous silicon film 148c, amorphous silicon film 144b, amorphous silicon film 140a, and amorphous silicon film 136 respectively, and first word line lead lines 7a which are connected to the amorphous silicon film 148c, amorphous silicon film 144b, amorphous silicon film 140a, and amorphous silicon film 136 respectively are formed. Third word line lead lines 7c may be formed at the same time as the process for forming the first word line lead lines 7a. Then, wires such as a bit line and first word line lead lines are formed and the semiconductor memory device 1 of the present invention related to the present embodiment is complete.

In the semiconductor memory device 1 of the present invention related to the present embodiment, because each word line WL1-WL4 (7) is formed by a common conducting layer for each layer (memory cell layer) in which a plurality of memory cells are formed in two dimensions (that is, in a planar direction), it is possible to significantly reduce the number of word line driving circuits 3 and realize a reduction in chip size. In addition, the end part of each word line 7 of the memory transistor region 2 is formed in a step shape and first word line lead lines 7a are respectively connected to the end part of each word line formed in this step shape. In this way, it is possible to densely arrange lead lines of the word line 7 by forming the end part of each word line 7 in a step shape.

(Embodiment Two)

In the semiconductor memory device 1 of the present invention related to embodiment one, an example is explained in which the ends of word lines 7 were each formed in step shapes in a direction parallel with bit lines 8. In the semiconductor memory device 1 of the present invention related to embodiment two, the step shaped structure of the ends of word lines 7 as in embodiment one is formed in a direction parallel to a bit line 8 and a plurality of these step shaped structures are formed in a perpendicular direction to the bit line 8. As a result, it is possible to more densely form the word line lead lines. Furthermore, because the semiconductor memory device 1 related to embodiment two has the same structure as the semiconductor memory device 1 related to embodiment one apart from the structure of the end parts of the word lines 7, the structure which is the same as the semiconductor memory device 1 related to embodiment one will not be explained again here.

(Manufacturing Method of a Semiconductor Memory Device of the Present Invention Related to Embodiment Two)

A manufacturing method of the semiconductor memory device 1 of the present invention related to embodiment two will be explained using FIG. 10-FIG. 15. Furthermore, the manufacturing method explained below is one example of a manufacturing method of the semiconductor memory device 1 of the present invention related to the present embodiment and is not limited to this example. In addition, for the purposes of explanation, the memory transistor region 2 and the word line lead lines 7a-7c of the semiconductor memory device related to embodiment two are shown in FIG. 10 to FIG. 15. In the semiconductor memory device 1 of the present invention related to embodiment two, an example is explained in the case where there are twelve word lines 7 (twelve amorphous silicon layers which form the word lines 7). Further, the number of word lines 7 is not limited to this number.

Figure 10:
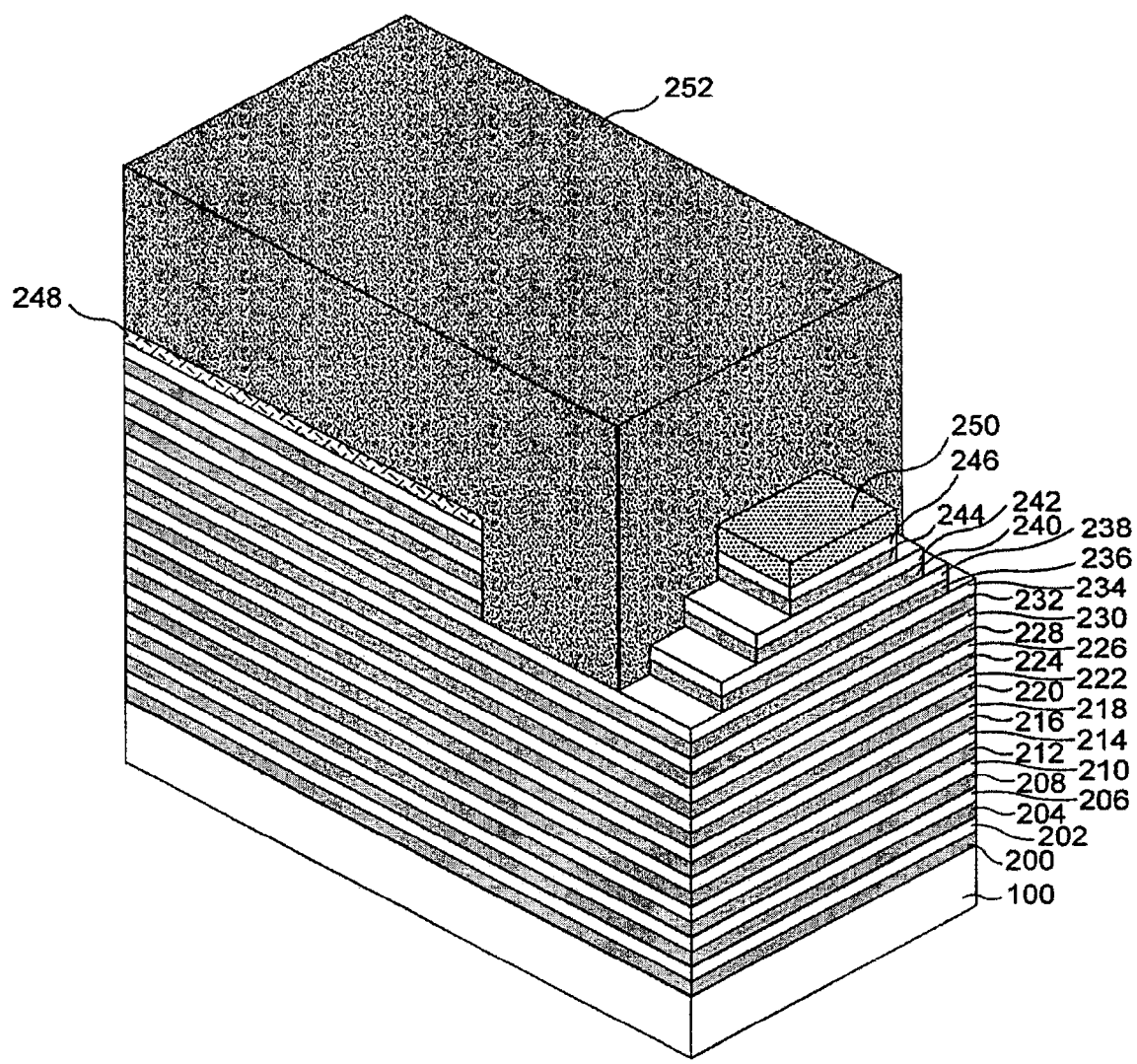
FIG. 10 is a diagram which shows a manufacturing process of the semiconductor memory device 1 related to one embodiment of the present invention.

First, a substrate part 100 is formed by the same method explained in embodiment one. Then, an amorphous silicon film 200, a silicon oxide film 202, an amorphous silicon film 204, a silicon oxide film 206, an amorphous silicon film 208, a silicon oxide film 210, an amorphous silicon film 212, a silicon oxide film 214, an amorphous silicon film 216, a silicon oxide film 218, an amorphous silicon film 220, a silicon oxide film 222, an amorphous silicon film 224, a silicon oxide film 226, an amorphous silicon film 228, a silicon oxide film 230, an amorphous silicon film 232, a silicon oxide film 234, an amorphous silicon film 236, a silicon oxide film 238, an amorphous silicon film 240, a silicon oxide film 242, an amorphous silicon film 244, a silicon oxide film 246 and a silicon nitride film 248 are formed in order on the substrate part 100. Next, a part of the silicon nitride film 248 is etched, a BPSG film 250 is formed and a CMP process is performed until the surface of the silicon nitride film 248 is exposed. Then, a photoresist 252 is formed and the amorphous silicon film 236, silicon oxide film 238, amorphous silicon film 240, silicon oxide film 242, amorphous silicon film 244, silicon oxide film 246 and BPGS film 250 are formed in a step shape using the same process explained in embodiment one (FIG. 10).

Figure 11:
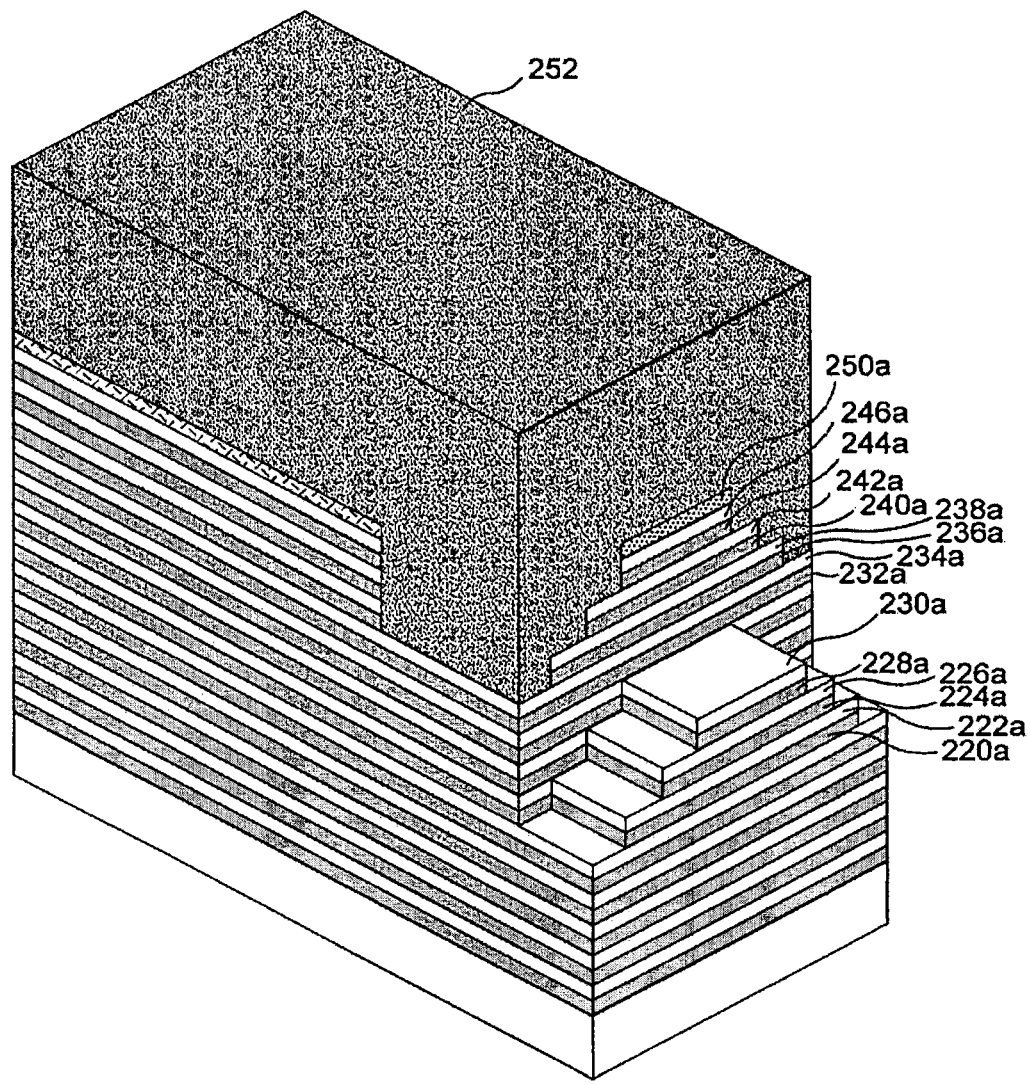
FIG. 11 is a diagram which shows a manufacturing process of the semiconductor memory device 1 related to one embodiment of the present invention.

Next, the amorphous silicon film 232, silicon oxide film 234, amorphous silicon film 236, silicon oxide film 238, amorphous silicon film 240, silicon oxide film 242, amorphous silicon film 244, silicon oxide film 246 and BPSG film 250, and amorphous silicon film 220, silicon oxide film 222, amorphous silicon film 224, silicon oxide film 226, amorphous silicon film 228 and silicon oxide film 230 are etched together using the photoresist 252, and the amorphous silicon film 232a, silicon oxide film 234a, amorphous silicon film 236a, silicon oxide film 238a, amorphous silicon film 240a, silicon oxide film 242a, amorphous silicon film 244a, silicon oxide film 246a and BPSG film 250a, and the amorphous silicon film 220a, silicon oxide film 222a, amorphous silicon film 224a, silicon oxide film 226a, amorphous silicon film 228a and silicon oxide film 230a are formed (FIG. 11).

Figure 12:
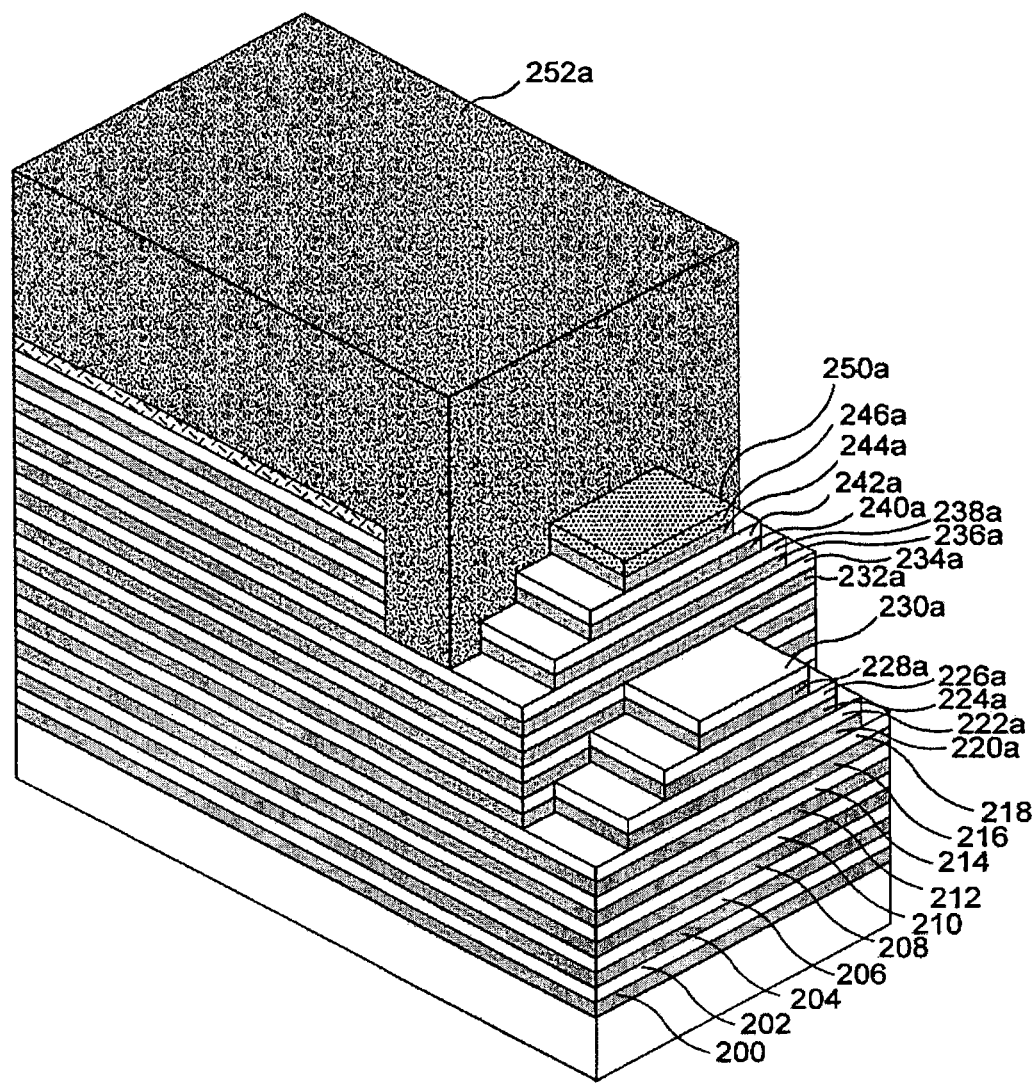
FIG. 12 is a diagram which shows a manufacturing process of the semiconductor memory device 1 related to one embodiment of the present invention.
Figure 13:
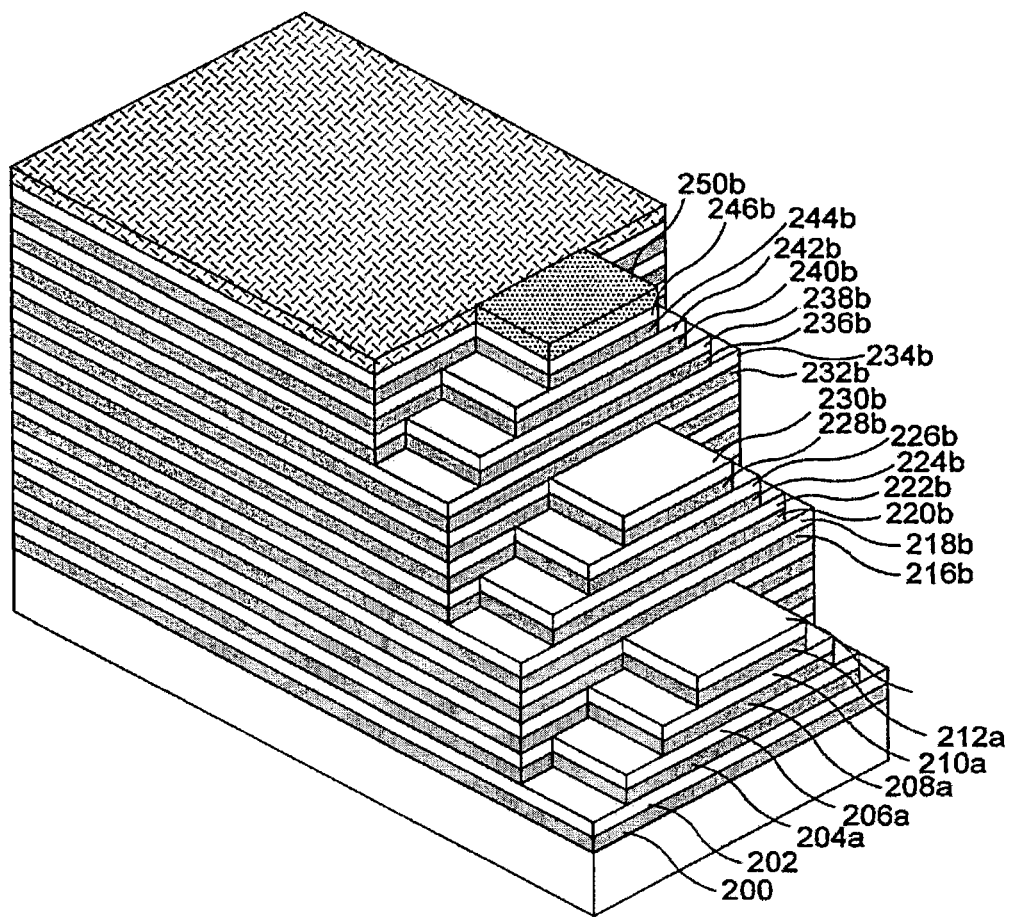
FIG. 13 is a diagram which shows a manufacturing process of the semiconductor memory device 1 related to one embodiment of the present invention.

Then, the photoresist 252 is slimmed without peeling and a photoresist 252a is formed (FIG. 12). Next, the amorphous silicon film 232a, silicon oxide film 234a, amorphous silicon film 236a, silicon oxide film 238a, amorphous silicon film 240a, silicon oxide film 242a, amorphous silicon film 244a, silicon oxide film 246a and BPSG film 250a and the amorphous silicon film 220a, silicon oxide film 222a, amorphous silicon film 224a, silicon oxide film 226a, amorphous silicon film 228a and silicon oxide film 230a and the amorphous silicon film 204, silicon oxide film 206, amorphous silicon film 208, silicon oxide film 210, amorphous silicon film 212 and silicon oxide film 214, amorphous silicon film 216 and silicon oxide film 218 are etched together and the amorphous silicon film 232b, silicon oxide film 234b, amorphous silicon film 236b, silicon oxide film 238b, amorphous silicon film 240b, silicon oxide film 242b, amorphous silicon film 244b, silicon oxide film 246b and BPSG film 250b and the amorphous silicon film 220b, silicon oxide film 222b, amorphous silicon film 224b, silicon oxide film 226b, amorphous silicon film 228b and silicon oxide film 230b and the amorphous silicon film 204a, silicon oxide film 206a, amorphous silicon film 208a, silicon oxide film 210a, amorphous silicon film 212a, silicon oxide film 214a, amorphous silicon film 216a and silicon oxide film 218a are formed (FIG. 13).

Figure 14:
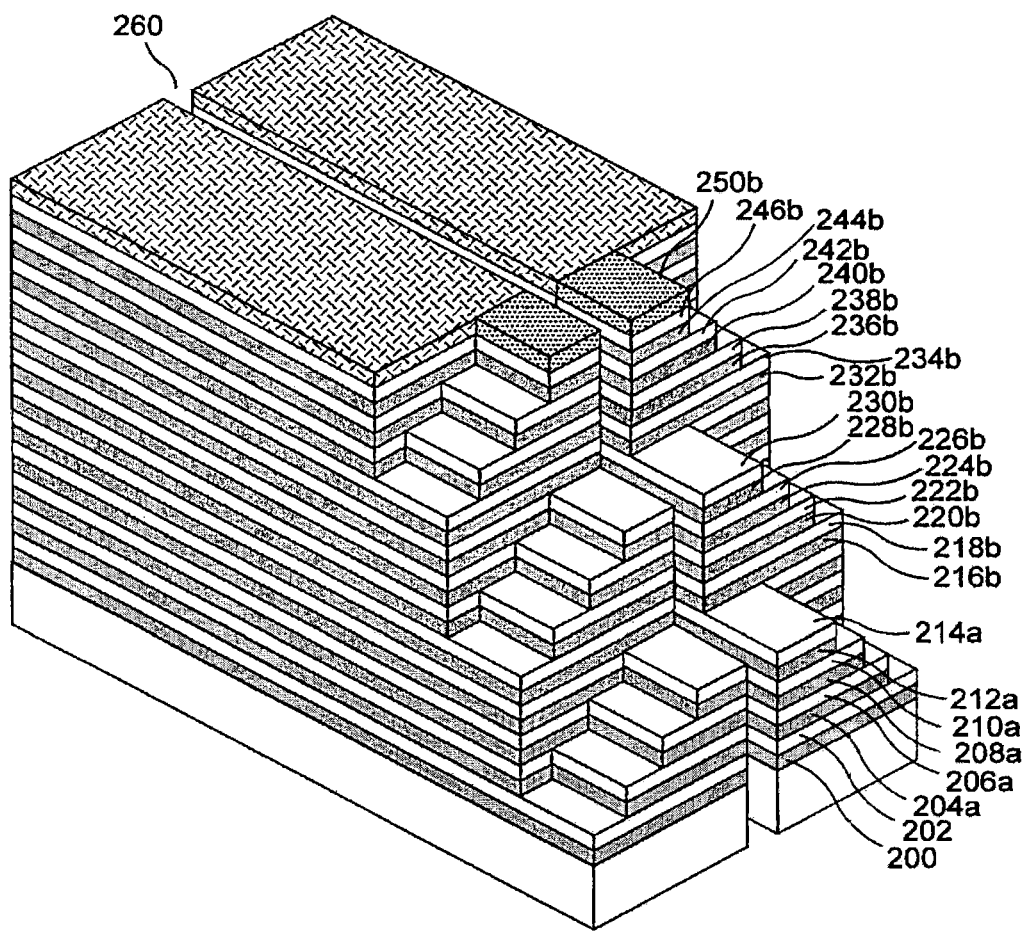
FIG. 14 is a diagram which shows a manufacturing process of the semiconductor memory device 1 related to one embodiment of the present invention.

Following this, the photoresist 252a is removed by peeling. Next, a photoresist (not shown in the figure) is formed and a slit 260 is formed the same as in embodiment one (FIG. 14).

Next, memory plug holes 170 (not shown in the figure) are formed only for the number of memory strings by the same process as in embodiment one. Next, a silicon oxide film, silicon nitride film, silicon oxide film and amorphous silicon film (all not shown in the figure) are formed in this order. Next, the amorphous silicon film is etched by RIE and a spacer is formed. The silicon oxide film (first insulation film), silicon nitride film and silicon oxide film (second insulation film) form what is called an ONO film. The silicon nitride film becomes a charge accumulation layer of the memory transistor. Furthermore, an insulation film such as alumina may be used instead of the silicon oxide film Next, the silicon oxide film, silicon nitride film and silicon oxide film are etched using the spacer of the amorphous silicon film formed in the memory plug hole 170 and a part of the amorphous silicon film 130 formed in the hole 126 is exposed. Next, after forming an amorphous silicon film in order to fill the memory plug hole 170 a planarization process is performed by CMP for example. Next, As ions are implanted and a drain diffusion layer 172 is formed using RTA. Then, an upper part selection transistor is formed by the same process which forms the lower part selection transistor.

Figure 15:
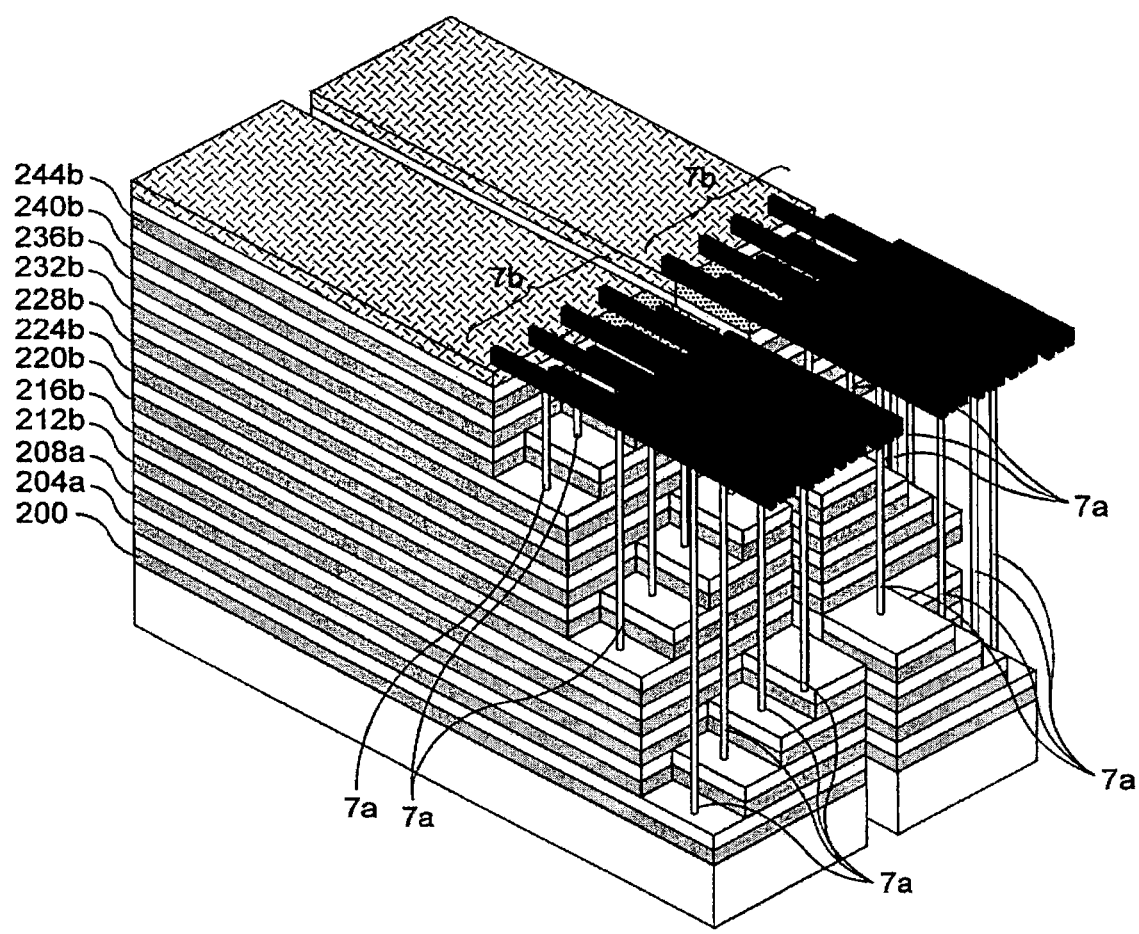
FIG. 15 is a diagram which shows a manufacturing process of the semiconductor memory device 1 related to one embodiment of the present invention.

Next, as is shown in FIG. 15, the amorphous silicon films 200, 204a, 208a, 212a, 216a, 220b, 224b, 228b, 232b, 236b, 240b and 244b are each formed in a contact hole respectively and first word line leads lines 7a which connect to the amorphous silicon films 200, 204a, 208a, 212a, 216a, 220b, 224b, 228b, 232b, 236b, 240b and 244b respectively are formed. Third word line lead lines 7c may be formed at the same time as the process for forming the first word line lead lines 7a. Then, bit line wires and first word line lead line wires are formed and the semiconductor memory device 1 of the present invention related to the present embodiment is complete.

In the semiconductor memory device 1 of the present invention related to embodiment two, the step shaped structure of the end part of the word lines 7 as in embodiment one is formed in a direction parallel to a bit line 8, and a plurality of these step shaped structures are also formed in a direction perpendicular to a bit line 8. As a result, it is possible to more densely form the word line lead lines.

(Embodiment Three)

The semiconductor memory device 1 of the present invention related to embodiment three includes a structure in which a plurality of semiconductor memory devices 1 related to embodiment one are stacked in a longitudinal direction. Furthermore, because other structures are the same as in the semiconductor memory device 1 of the present invention related to embodiment one, they will not be explained again here.

Figure 16:
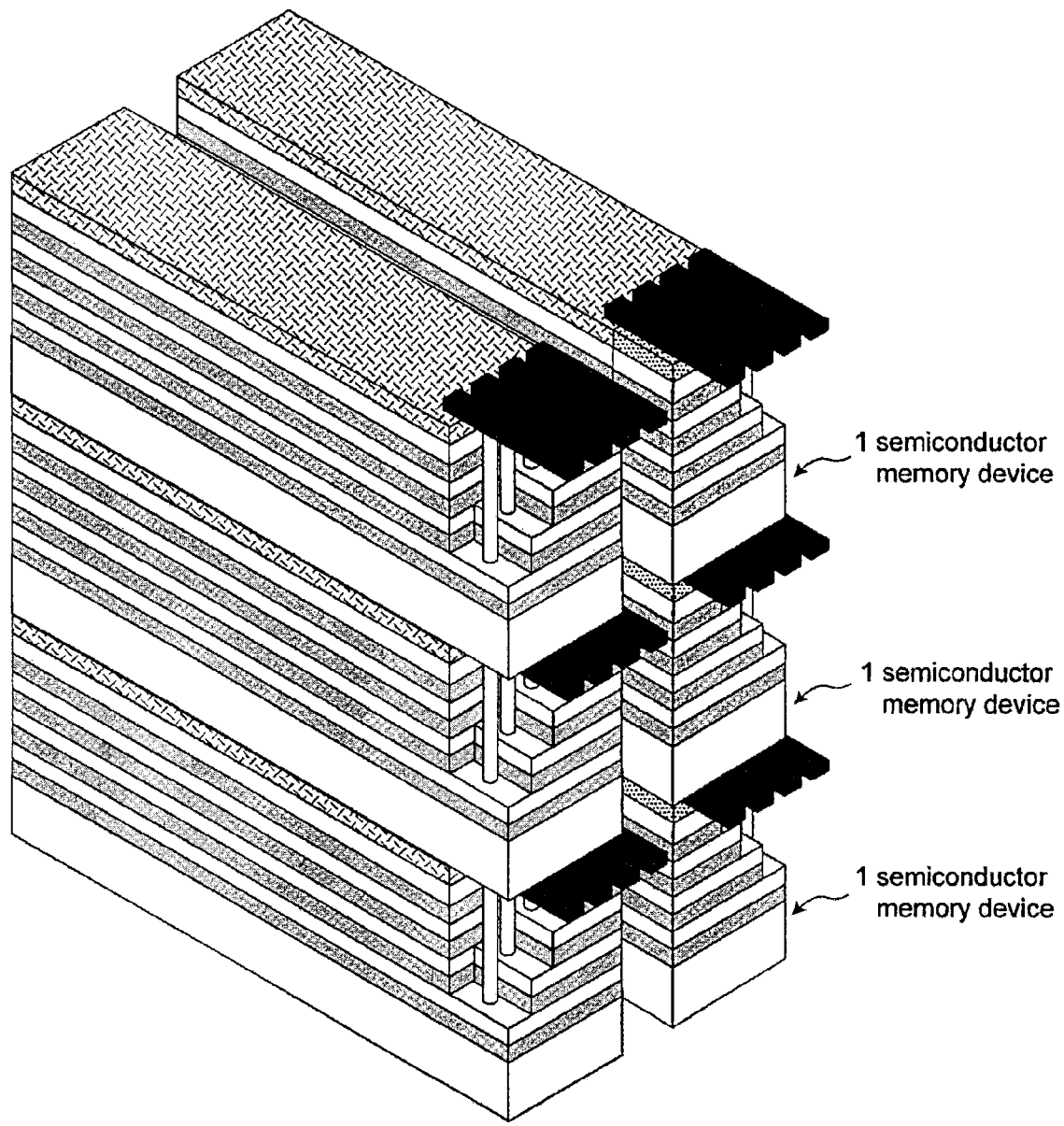
FIG. 16 is an approximate structural view of the semiconductor memory device 1 related to one embodiment of the present invention.

As is shown in FIG. 16, the semiconductor memory device 1 of the present invention related to embodiment three has a structure in which three semiconductor memory devices 1 of the present invention related to embodiment one are stacked in a longitudinal direction. Furthermore, in embodiment three, three semiconductor memory devices 1 of the present invention related to embodiment one which are stacked in a longitudinal direction are explained as an example. However, the number is not limited to three.

According to the semiconductor memory device 1 of the present invention related to embodiment three it is possible to more densely integrate memory transistors.

(Embodiment Four)

The semiconductor memory device 1 of the present invention related to embodiment four includes a structure in which a plurality of semiconductor memory devices 1 of the present invention related to embodiment two are stacked in a longitudinal direction. Furthermore, because other structures are the same as in the semiconductor memory device 1 of the present invention related to embodiment two, they will not be explained again here.

Figure 17:
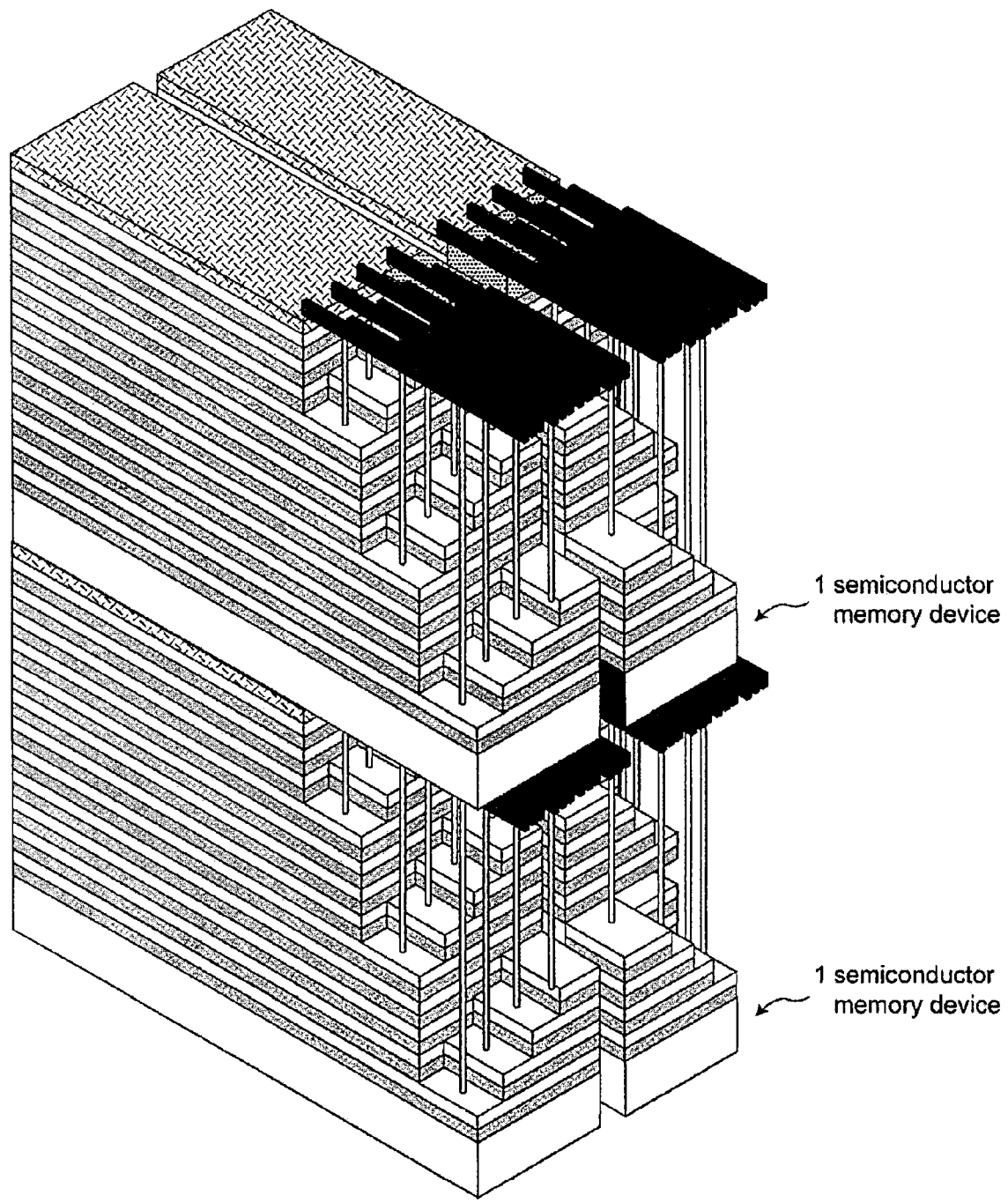
FIG. 17 is an approximate structural view of the semiconductor memory device 1 related to one embodiment of the present invention.

As is shown in FIG. 17, the semiconductor memory device 1 of the present invention related to embodiment four has a structure in which two semiconductor memory devices 1 of the present invention related to embodiment two are stacked in a longitudinal direction. Furthermore, in embodiment four, two semiconductor memory devices 1 of the present invention related to embodiment two which are stacked in a longitudinal direction are explained as an example. However, the number is not limited to two.

According to the semiconductor memory device 1 of the present invention related to embodiment four it is possible to more densely integrate memory transistors.

According to one embodiment of the present invention, word line lead parts of a semiconductor memory device have a step structure and by arranging contacts in these step parts it is possible to reduce the area lead wire parts to a word line and reduce the area of the chip.

What is claimed is:

1. A semiconductor memory device comprising:
a stacking structure having a plurality of conductive layers and a plurality of insulation layers, the plurality of conductive layers and the plurality of insulation layers being stacked alternately and extending in two dimensions, the plurality of conductive layers including a memory transistor region and a contact region arranged in a first direction, the contact region being arranged in end parts of the plurality of conductive layers, the end parts of the plurality of conductive layers in the contact region collectively being formed in a step shape in a second direction perpendicular to the first direction, and both edges of the plurality of conductive layers in the memory transistor region in the second direction being aligned respectively;
a semiconductor column arranged in the stacking structure, the semiconductor column extending in a third direction perpendicular to the first and second directions in the stacking structure; and
memory portions arranged between the semiconductor column and each of the plurality of conductive layers.

2. The semiconductor memory device according to claim 1, wherein both ends of the end parts of the plurality of conductive layers in the contact region are collectively formed in a step shape in the second direction.

3. The semiconductor memory device according to claim 1, wherein a plurality of word lead lines are each arranged on the end parts of the plurality of conductive layers.

4. The semiconductor memory device according to claim 1, wherein a plurality of contacts is each arranged on the end parts of the plurality of conductive layers.

5. The semiconductor memory device according to claim 1, wherein the plurality of conductive layers are each plate shaped.

6. The semiconductor memory device according to claim 1, further comprising a plurality of semiconductor columns arranged in the stacking structure, the plurality of semiconductor columns extending in the third direction in the stacking structure,
wherein the plurality of semiconductor columns are arranged in a matrix in an in-plane surface perpendicular to the plurality of semiconductor columns.

7. The semiconductor memory device according to claim 1, wherein the plurality of conductive layers in the contact region are collectively formed in a step shape in the first direction.

8. The semiconductor memory device according to claim 7, wherein the plurality of conductive layers in the contact region are collectively formed in the step shape layer by layer in the second direction, and
several layers of the plurality of conductive layers in the contact region are collectively formed in the step shape in the first direction.

9. A semiconductor memory device comprising:
a memory string having a plurality of memory cells, the plurality of memory cells being connected in series, the memory string extending in a first direction; and
a plurality of conductive layers and a plurality of insulating layers being stacked alternately in the first direction and extending in two dimensions, the plurality of conductive layers including a memory transistor region and a contact region, the memory transistor region being formed by a gate electrode of each of the plurality of memory cells, the contact region being arranged in end parts of the plurality of conductive layers in a second direction perpendicular to the first direction, the plurality of conductive layers in the contact region collectively being formed in a step shape in a third direction perpendicular to the first and second directions, and both edges of the plurality of conductive layers in the memory transistor region in the third direction being aligned respectively.

10. The semiconductor memory device according to claim 9, wherein both ends of the end parts of the plurality of conductive layers in the contact region are collectively formed in a step shape in the third direction.

11. The semiconductor memory device according to claim 9, wherein a plurality of word lead lines are each arranged on the end parts of the plurality of conductive layers.

12. The semiconductor memory device according to claim 9, wherein a plurality of contacts are each arranged on the end parts of the plurality of conductive layers.

13. The semiconductor memory device according to claim 9, further comprising a plurality of memory strings, each of the plurality of memory strings having a plurality of memory cells, the plurality of memory cells being connected in series, the plurality of memory strings extending in a first direction respectively, wherein the plurality of memory strings are arranged in a matrix in an in-plane surface perpendicular to the plurality of memory strings.

14. The semiconductor memory device according to claim 9, wherein the plurality of conductive layers in the contact region are collectively formed in a step shape in the second direction.

15. The semiconductor memory device according to claim 14, wherein the plurality of conductive layers in the contact region are collectively formed in the step shape layer by layer in the third direction, and
    several layers of the plurality of conductive layers in the contact region are collectively formed in the step shape in the second direction.

* * * * *